(12) United States Patent
Forghani-zadeh et al.

(10) Patent No.: US 7,817,393 B2
(45) Date of Patent: Oct. 19, 2010

(54) POWER DISTRIBUTION SWITCH CIRCUITS WITH FAST RESPONSES TO HARD SHORT-CIRCUITS

(75) Inventors: H. Pooya Forghani-zadeh, Dallas, TX (US); Thomas A. Schmidt, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 12/198,360

(22) Filed: Aug. 26, 2008

(65) Prior Publication Data
US 2010/0053832 A1    Mar. 4, 2010

(51) Int. Cl.
*H02H 3/08* (2006.01)
*H02H 9/02* (2006.01)
(52) U.S. Cl. .................. 361/93.2; 361/93.7; 361/93.1
(58) Field of Classification Search ............. 361/93.2, 361/93.7, 93.1
See application file for complete search history.

(56) References Cited

U.S. PATENT DOCUMENTS

| 4,779,007 | A | * | 10/1988 | Schlanger et al. ........... 307/66 |
| 4,851,742 | A | * | 7/1989 | Chapman .................. 318/286 |
| 5,375,029 | A | | 12/1994 | Fukunaga et al. |
| 5,672,958 | A | * | 9/1997 | Brown et al. .............. 323/269 |
| 5,747,975 | A | * | 5/1998 | Colandrea et al. .......... 323/276 |
| 6,034,448 | A | * | 3/2000 | Xu et al. .................. 307/127 |
| 6,127,882 | A | | 10/2000 | Vargha et al. |
| 6,400,203 | B1 | | 6/2002 | Bezzi et al. |
| 6,717,787 | B2 | * | 4/2004 | Barker .................... 361/93.7 |
| 6,928,379 | B2 | * | 8/2005 | Fulton et al. .............. 702/130 |
| 6,947,272 | B2 | | 9/2005 | Daniels et al. |
| 6,954,108 | B2 | | 10/2005 | Hastings et al. |
| 7,071,740 | B2 | | 7/2006 | Adams et al. |
| 7,580,271 | B2 | * | 8/2009 | Chiang et al. .............. 363/17 |
| 2008/0265855 | A1 | * | 10/2008 | Vest et al. ................. 323/280 |

* cited by examiner

*Primary Examiner*—Stephen W Jackson
*Assistant Examiner*—Zeev Kitov
(74) *Attorney, Agent, or Firm*—William B. Kempler; Wade J. Brady, III; Frederick J. Telecky, Jr.

(57) ABSTRACT

Methods and apparatus to provide power distribution switch circuits with fast responses to hard short-circuits are disclosed. In one example, a power distribution switch to detect a hard short-circuit condition is described, comprising a switching device having a resistance between an input terminal and an output terminal, to conduct a current from an input power source having an input voltage to an output terminal having an output voltage, a voltage feedback loop having a digital output voltage to increase the resistance of the switching device in response to a short-circuit based on the output voltage, and an analog current feedback loop to increase the resistance of the switching device based on a current through the switching device and a reference current.

17 Claims, 6 Drawing Sheets

US 7,817,393 B2

POWER DISTRIBUTION SWITCH CIRCUITS WITH FAST RESPONSES TO HARD SHORT-CIRCUITS

FIELD OF THE DISCLOSURE

This disclosure relates generally to power distribution switches and, more particularly, to power distribution switch circuits with fast responses to hard short-circuits.

BACKGROUND

Power distribution switches are used in power management integrated circuits (PMICs) to distribute power to subsystems. In one example, power distribution switches are used to limit the current flowing to an output device. For example, in a computer system a power distribution switch may couple a power source to an output terminal, thereby supplying power to an attached device. Some devices are currently limited to 0.5 amperes (A) of current for extended periods, but the devices may occasionally draw more current than this limit. If a device overdraws current for too long, the power distribution switch may increase its resistance, thereby reducing the current draw and preventing the device from significantly affecting the voltage level of the power source.

Conventional power distribution switches include analog feedback loops to monitor the input to the power distribution switch for excessive current draw by a device drawing power from the output. In an example, a sense resistor is placed in series with the current supply to generate a sense voltage that is compared to a desired reference voltage at an amplifier. In such arrangements, the output of the amplifier controls the power distribution switch coupling the power source to the output terminal, and increases the resistance of the switch if the sense voltage indicates that too much current is being drawn. However, in the case of a hard short circuit condition (e.g., a condition in which the resistance between an output terminal of the power supply and ground drops to roughly 0.1 ohms ($\Omega$)), large currents may flow through the power distribution switch before the feedback loop can respond to increase resistance of the power distribution switch. This condition may be damaging to the power distribution switch, the power switch device, or may lead to a situation in which the power source voltage is pulled below tolerable levels.

SUMMARY

Power distribution switches with fast responses to hard short-circuits are disclosed. In one example, a power distribution switch to detect a hard short-circuit condition is described. The power distribution switch includes a switching device having a resistance between an input terminal and an output terminal, to conduct a current from an input power source having an input voltage to an output terminal having an output voltage. To detect short-circuits, the power distribution switch also includes a voltage feedback loop having a digital output voltage to increase the resistance of the switching device in response to a short-circuit based on the output voltage and an analog current feedback loop to increase the resistance of the switching device based on a current through the switching device and a reference current.

DETAILED DESCRIPTION

This disclosure describes example power distribution switches having fast responses to hard short-circuit conditions at an output terminal. In contrast with previous power distribution switches that use only an analog current feedback loops to monitor and control an input power source, the described examples use a fast-response voltage feedback loop to monitor the output terminal voltage with respect to a reference voltage that is based on the input power source voltage. The example power distribution switch includes several conduction paths to conduct current from the input power source to the output terminal. If the output terminal voltage decreases below the reference voltage, the voltage feedback loop increases the overall resistance of the power distribution switch by decoupling a portion of the conduction paths in the power distribution switch.

At least some of the example power distribution switches described below benefit from several advantages over the prior art. For example, the example described power distribution switches limit excessive currents caused by hard short-circuit conditions much faster than conventional circuits. As a result, decoupling capacitor requirements at the input of the power distribution switches are relaxed significantly. Further, the example power distribution switch limits the energy surge that may occur during short-circuits in conventional circuits, which may cause system instability or shutdown.

In the following described examples, a hard short-circuit condition (or hard short) refers to a situation in which an output terminal is coupled to the ground reference (i.e., 0 V) with a resistance of around 0.1$\Omega$ or less. However, in certain implementations other resistances may be considered a hard short. For a larger switch resistance, a 1$\Omega$ or 2$\Omega$ short may be considered a hard short. It is therefore contemplated that the examples described herein may be modified to provide any power distribution switches with fast-response hard short protection where a benefit may be realized.

Figure 1:
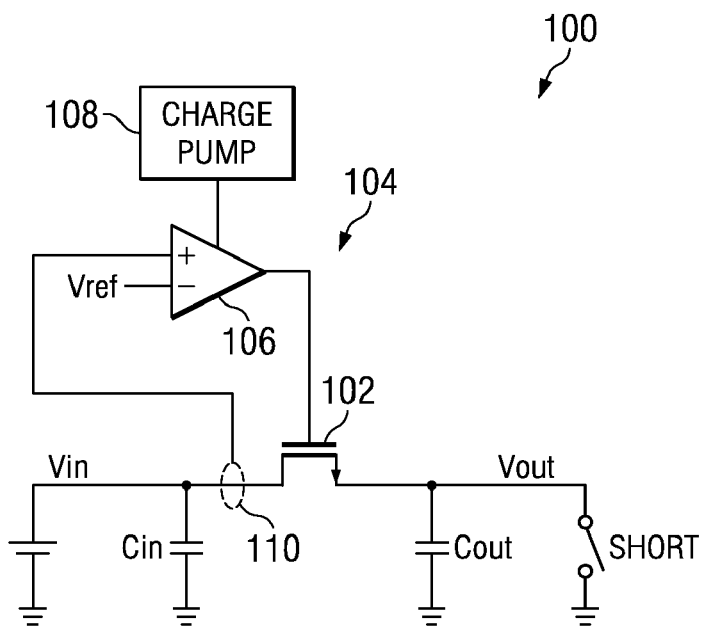
FIG. 1 is a block diagram of a conventional power distribution switch to provide current limiting.

FIG. 1 is a block diagram of a conventional power distribution switch 100 to provide current limiting. The power distribution switch 100 includes an n-type field effect transistor (FET) 102 to couple an input power source having an input voltage (Vin) to an output terminal, which has an output voltage (Vout). The output terminal is coupled to an output device (not shown), which draws a current from the input power source via the FET 102.

The current through the FET 102 is monitored by an analog current feedback loop 104, which includes an amplifier 106 to control the FET 102, a charge pump 108 to provide a supply voltage to the amplifier 106, and a sense resistor 110 to generate a current sense signal to the amplifier 106. The amplifier 106 continuously monitors the current flowing through the FET 102 via the current sense signal, compares the current sense signal to a reference voltage indicative of a desired current limit, and adjusts the control voltage to the FET 102.

While the FET 102 current is below the current limit, the amplifier 106 output saturates to the charge pump 108 voltage. However, as the FET 102 current increases past the current limit, the current sense signal decreases below the reference voltage. As a result, the amplifier reduces the control voltage to the FET 102 and decreases the current flowing therethrough.

Figure 2:
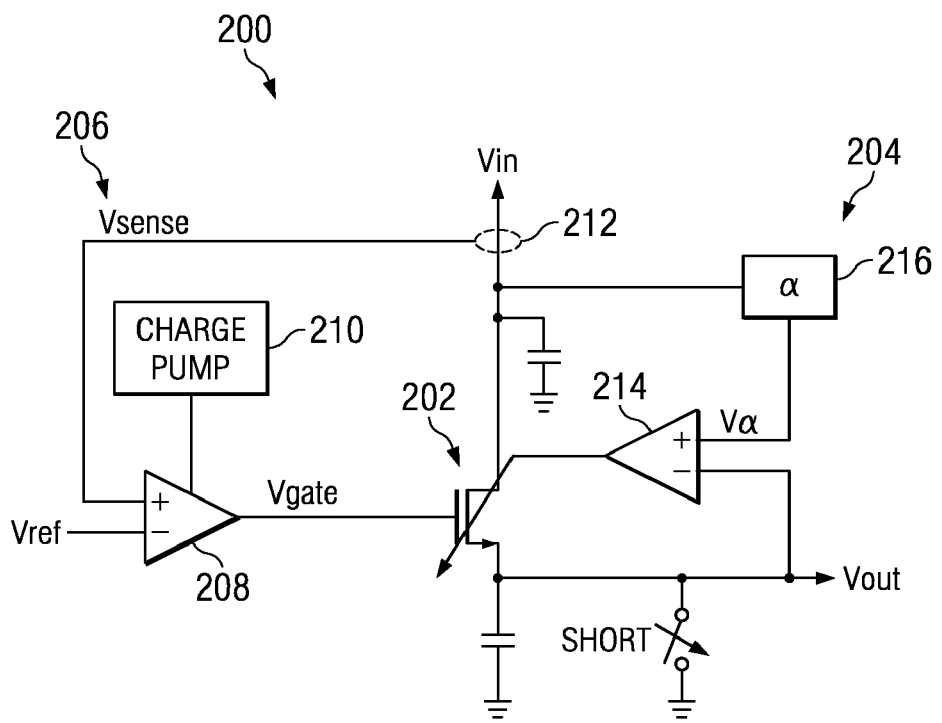
FIG. 2 is a block diagram of an example power distribution switch including a digital voltage feedback loop according to the described examples.

FIG. 2 is a block diagram of an example power distribution switch 200 including a digital voltage feedback loop 204 according to the described examples. The power distribution switch 200 couples an input power source (Vin) to an output terminal (Vout) to provide power to one or more output devices (not shown) coupled to Vout. A switching device 202, shown in FIG. 2 as an n-type field effect transistor (FET), conducts current from Vin to Vout, and has a series resistance based on a number of conduction paths in the switching device 202. The current flowing through the switching device 202 is controlled by the digital voltage feedback loop 204 and an analog current feedback loop 206. The analog current feedback loop 206 includes an amplifier 208, a charge pump 210, and a current sense device 212. The analog current feedback loop 206 controls the series resistance of the switching device 202 by generating and adjusting a gate voltage (Vgate) in response to currents flowing through the switching device. In the example power distribution switch 200, the analog current feedback loop 206 increases the series resistance of the switching device 202 by decreasing Vgate. A charge pump 210 provides the amplifier 208 with a voltage higher than Vin, thereby allowing the gate voltage from the amplifier to minimize the series resistance of the switching device 206 and increasing efficiency during normal operation.

To further control the switching device, the power distribution switch 200 includes a comparator 214 and a reference block 216 to implement the digital voltage feedback loop 204. In contrast to the analog current feedback loop 206, the comparator 214 of the example digital voltage feedback loop 204 generates a digital signal to rapidly shut down one or more conduction paths of the switching device 202, which raises the series resistance of the switching device 202. The digital signal generated by the comparator 214 is based on the output voltage Vout and a reference voltage (e.g., a fraction α of Vin) supplied by the reference block 216. Because Vin and Vout are substantially the same during normal operation, the comparator 214 compares Vout to a fraction α of Vin (e.g., 0.9*Vin) via the reference block 216. The resulting voltage (Vα) is input to the comparator 214 as a reference voltage to be compared to Vout for hard short detection.

During normal operation, the power distribution switch 200 couples Vin to Vout via the switching device 202. The current sense device 212 generates a sense voltage (Vsense) indicative of the current flowing through the switching device 202. The amplifier 208 adjusts Vgate based on a comparison of Vsense with a reference voltage (Vref) representing a current limit. While the switching device 206 current is less than the current limit represented by Vref (i.e., when Vsense is greater than Vref), the amplifier 208 outputs the voltage supplied thereto by the charge pump 210, thereby causing Vgate to go high and the switching device 206 to be fully on (i.e., having minimal series resistance). Because Vout has substantially the same voltage as Vin during normal operation, the comparator 214 compares Vout to Vα and allows the switching device 202 to remain on.

When a device coupled to the output terminal Vout draws current in excess of the current limit, the amplifier 208 detects a voltage decrease at Vsense. As the current draw reaches the current limit, Vsense decreases to Vref. When Vsense decreases below Vref, the amplifier 208 decreases Vgate and the series resistance of the switching device 202 increases, limiting the current through the switching device 202.

The comparator 214 monitors the output terminal (Vout) for voltage drops indicative of a hard short. Upon detection of a hard short, the comparator 214 increases the resistance of the switching device 202 to reduce the current through the switching device 202. This may be accomplished by, for example, disabling one or more conduction paths of the switching device 202, thereby increasing the series resistance of the switching device 202. Additionally or alternatively, the comparator 214 may increase the resistance of one or more of the conduction paths to increase the resistance of the switching device 202.

Figure 3:
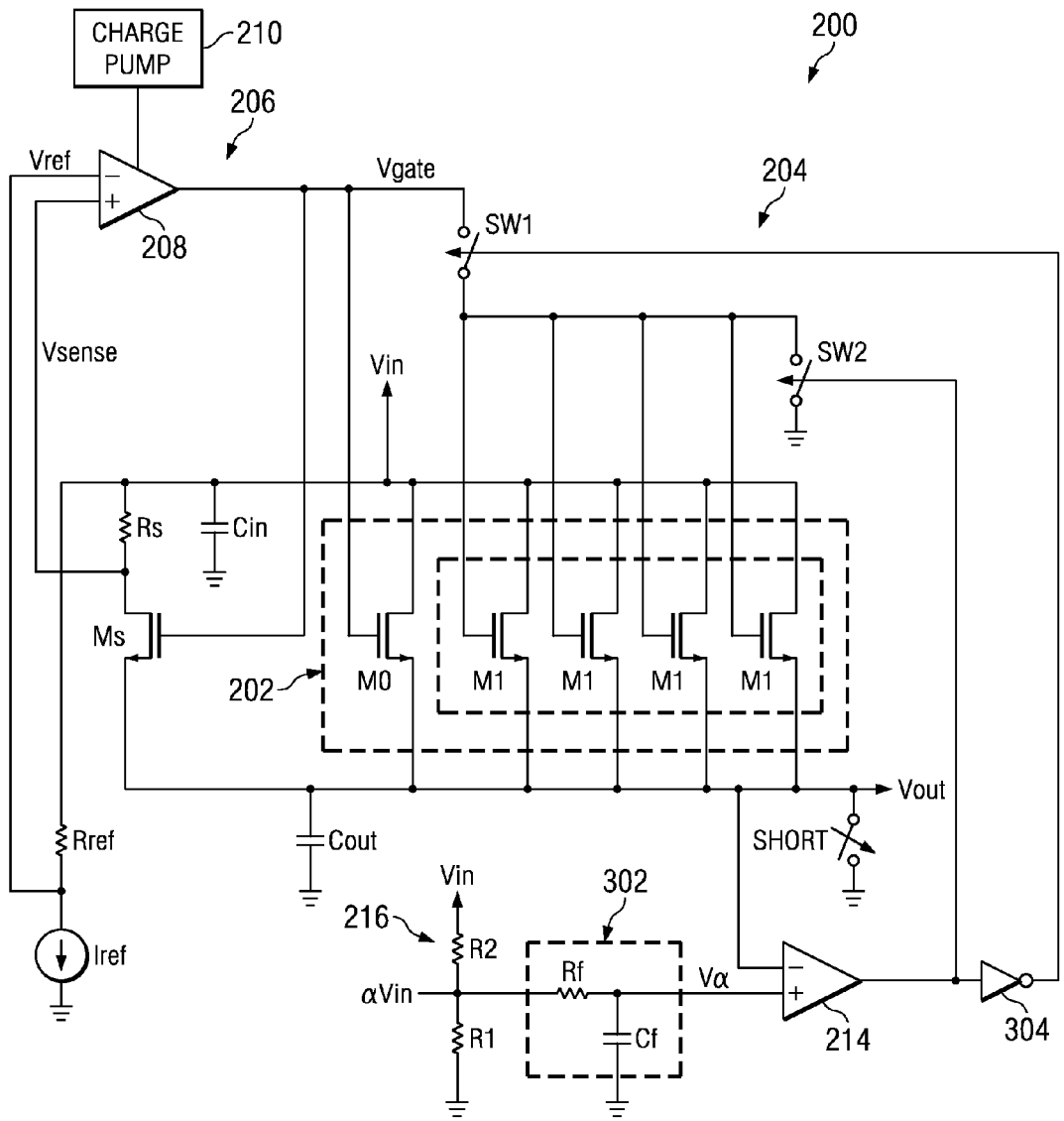
FIG. 3 is a more detailed schematic diagram of the example power distribution switch of FIG. 2 according to the described examples.

FIG. 3 is a more detailed schematic diagram of the example power distribution switch 200 described in FIG. 2 according to the described examples. The example switching device 202 includes a first n-type FET M0 and several additional n-type FETs, M1. The FET M0 and the FETs M1 are implemented to have equal or substantially equal conduction paths (i.e., resistances) for a given control signal, through which current may flow from the input power source Vin to the output terminal Vout. M0 and M1 are further designed to have low $Rds_{on}$ (i.e., low conduction path resistance from the drain terminal to the source terminal of the FET when the transistors are on). A sense transistor (Ms) (e.g., an n-type FET) is also included to draw current through a sense resistor (Rs), generating a sense voltage (Vsense) that is indicative of the current flowing through the power distribution switch 200.

To control the transistors M0, M1, and Ms, the amplifier 208 generates a gate voltage (Vgate) based on the voltage difference between Vsense and a reference voltage (Vref). Vref is generated by a predetermined reference current source (Iref) and a predetermined reference resistor (Rref). Iref pulls current through Rref to set a particular Vref relative to Vin. The current limit of the power distribution switch 200 may be modified by changing the resistance of Rref or the current of Iref to set a desired current limit, depending on the particular implementation.

When a Vref is established, the amplifier 208 compares Vsense to Vref and adjusts the gate voltage according to the comparison. For example, if an acceptable current is flowing through the power distribution switch, Vsense will be at a higher voltage than Vref, and Vgate will increase to or remain at the input supply voltage from the charge pump 210. Thus, the switching device 202 will permit the current draw.

While the amplifier 208 is designed to limit current draw that is slowly increasing as described above, a digital voltage feedback loop 204 is included to rapidly respond to the very large current overdraws caused by a hard short condition much faster than what can be achieved with analog loop only. Proper response time may prevent the large currents from causing damage to the power distribution switch 200 or an attached output device. Therefore, the example power distribution switch 200 includes the digital voltage feedback loop 204 to provide fast response times to hard shorts.

The digital voltage feedback loop 204 includes the comparator 214 to monitor the output terminal voltage Vout with respect to the loop reference voltage (Vα), and to output a digital signal based on the output voltage. The digital signal from the comparator 214 is then used to turn off M1 immediately when a hard short occurs, thereby increasing the series resistance of the switching device 102 and limiting the current through the power distribution switch 200.

At the comparator 214, Vout is compared to a reference voltage Vα that is a fraction (α) of Vin. The example power distribution switch 200 utilizes an α of 0.9, which may be set and/or adjusted by appropriate selection of resistors R1 and R2 in a voltage divider configuration implementing the reference block 216. A value of 0.9*Vin is selected for this example implementation to provide the comparator 214 with good overdrive, while avoiding false hard short detections. By increasing α to 0.95, overdrive may be increased and response time to a hard short condition may be improved. However, false detections of hard short conditions are more likely to occur. In contrast, by decreasing α to 0.8, overdrive is decreased and the comparator 214 does not detect the Vout voltage drop as quickly.

Comparator overdrive, with respect to the example of FIG. 2, refers to how much an input voltage to the comparator 214 (e.g., Vout) is changed excessively with respect to a comparator reference voltage (e.g., Vα). For example, if Vout decreases to 0.5*Vin there is a larger overdrive than if Vout decreases to 0.7*Vin (with a constant Vin). The output of the comparator 214 changes states (e.g., 1→0) more quickly as overdrive increases (i.e., greater slew rate). Thus, larger overdrive at the input to the comparator 214 results in faster response to a hard short condition, which decreases the chances of damage to the power distribution switch 200 or an output device.

During a hard short condition, Vin may decrease significantly due to the sudden, large current flow to Vout. As a result of the voltage drop at Vin, the reference voltage Vα to the comparator 214 also decreases, which could delay the detection of the hard short by the comparator 214 and reduce overdrive. The example power distribution switch 200 includes an RC filter 302 to diminish a voltage drop at Vα relative to αVin (i.e., the voltage generated by the divider 216) for the comparator 214 to detect the hard short more quickly and maintain high overdrive. During normal operation, Vα is substantially equal to αVin. However, when Vin decreases quickly, the RC filter 302 prevents Vα from decreasing in voltage as quickly as αVin.

The output of the comparator 214 is coupled to switching elements SW2 and, via a logical inverter gate 304, SW1. The switching element SW1 is on (i.e., closed, conducting) during normal operation to couple the gate terminals of the transistors M1 to Vgate. The switching element SW2 is off (i.e., closed, non-conducting) during normal operation to decouple the gate terminals of M1 from the ground reference. When a hard short is detected, the comparator 214 output changes states to turn SW1 off and turn SW2 on, decoupling the gate terminals of M1 from Vgate and coupling the gate terminals to ground. In the example of FIG. 3, SW2 is coupled to the output of the comparator 214, which is at logic high during a hard short. The transistors M1 are cut off by their low gate voltage, which reduces the number of enabled conduction paths in the switching device 202. As M0 is the only conduction path to remain on, the series resistance of the switching device 202 increases, thereby increasing the voltage across M0 and decreasing the voltage Vout to reduce the current flowing through the power distribution switch 200.

The example FETs M1 include four n-type FETs to provide a particular M1:M0 ratio (e.g., 4:1). This ratio determines the change in series resistance experienced by the switching device 202 when a hard short is detected. The example ratio will generate an increase in series resistance of 400%. A larger ratio may generate a larger resistance increase and reduce series resistance during normal operation, but may introduce additional circuit complexity and cost. Generally, selecting the ratio depends on application and parameters such as input capacitor and switch's current-limit level requirement at the presence of a hard short.

The power distribution switch 200 may further include one or more filter capacitors Cin and Cout to filter and/or smooth the Vin and Vout voltages, respectively.

The switching elements SW1 and SW2 may be implemented using any appropriate device that may selectively couple two nodes based on an input. Example switches that may be used include FET transistors or bipolar transistors. Alternatively, SW1 and SW2 may be replaced by a three-way switch to couple the gate terminals of M1 to one of Vgate or the ground reference.

The reference current source Iref may be implemented using any type of current source. Example types of current sources include FET transistors and/or bipolar transistors, wherein the transistors have an appropriate bias voltage or current applied.

The example charge pump 210 may be implemented using any type of charge pump to generate a voltage greater than Vin (e.g., double of Vin).

Although the switching device 202 in the example power distribution switch 200 is shown using n-type FETs, it should be recognized that other implementations may utilize different types of switching devices 202. For example, the switching device 202 may be implemented using p-type FETs or bipolar transistors. However, alternative implementations of the switching device 202 are usually more costly in state-of-the-art integrated circuit process technologies.

The example power distribution switch 200 is implemented as part of a power management integrated circuit (IC). However, it should be recognized that the power distribution switch 200 may be used in the presented implementation or in a modified implementation to provide fast response to hard short-circuits in any type of stand-alone power distribution switches or power management ICs where any form of power management switch is used. Further, any or all portions of the circuit may be implemented using discrete components, additional ICs, or any combination thereof.

Figure 4:
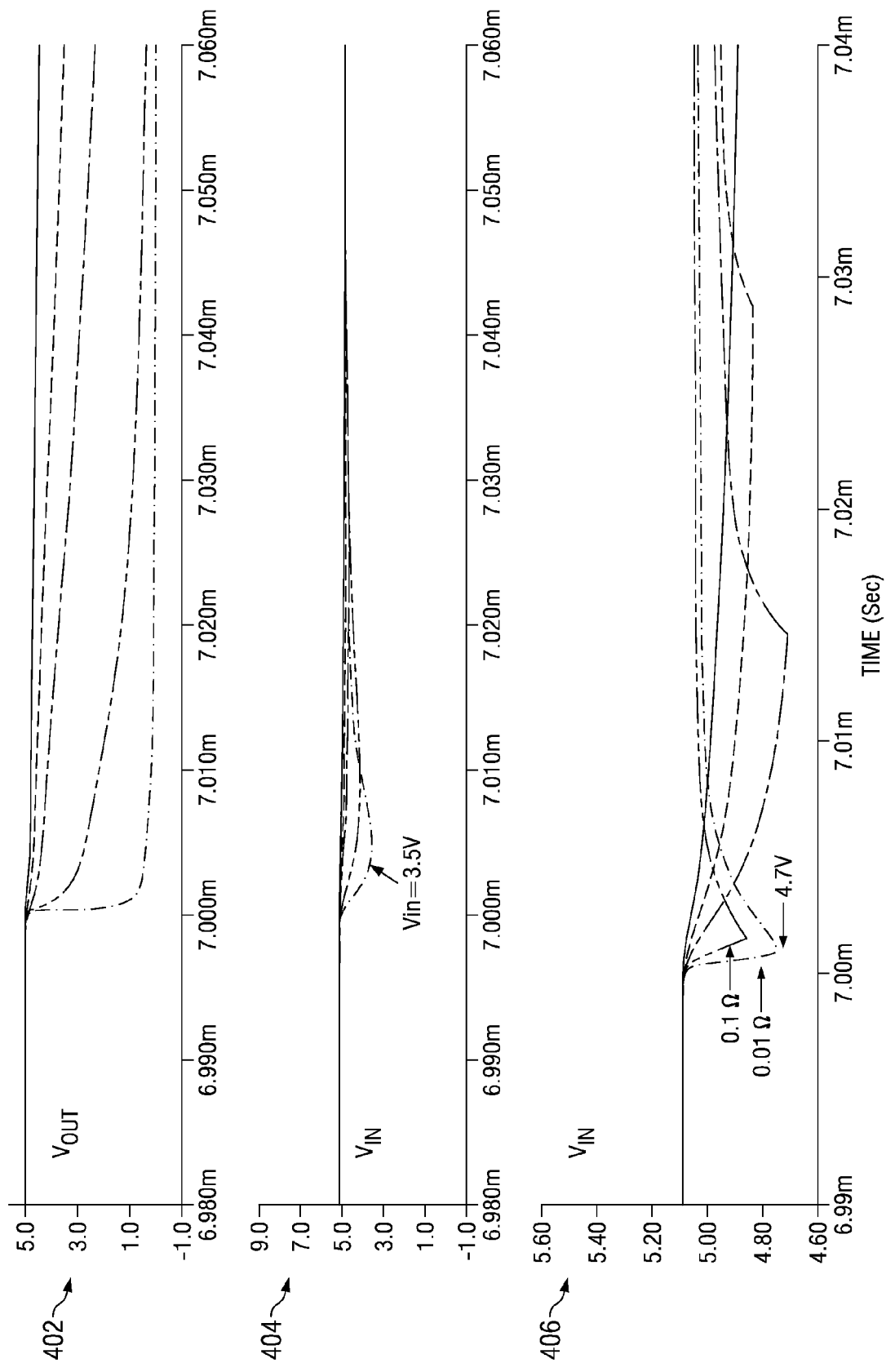
FIG. 4 is a comparative diagram of example circuit simulation waveform results from a simulation of the input voltage to the power distribution switch of FIG. 2 and the input voltage to the conventional circuit shown in FIG. 1.

FIG. 4 is a comparative diagram of example circuit simulation waveform results 402, 404, and 406 from a simulation of the input voltage Vin to the power distribution switch 200 of FIG. 2 and of the input voltage to the conventional circuit 100 shown in FIG. 1. The waveform set 402 illustrates the voltage at Vout for 0.01Ω, 0.1Ω, 0.5Ω, 1Ω, and 2Ω hard short-circuit conditions with no short-circuit detection. The waveform set 404 illustrates the temporary voltage decrease at Vin during each hard short using a conventional current limit technique, with the largest decrease occurring with a 0.01Ω hard short. The waveform set 406 illustrates the temporary voltage decrease at Vin during each hard short using the example power distribution switch 200 shown in FIG. 2. FIG. 4 illustrates the faster response of the present invention and reduced impact on the input power source. Specifically, the waveform set 404 illustrates a drop in the input voltage to 3.5V for a 0.01Ω hard short using traditional power distribution switches. In contrast, the waveform set 406 illustrates a drop in the input voltage to 4.7V for the same 0.01Ω hard short.

Figure 5:
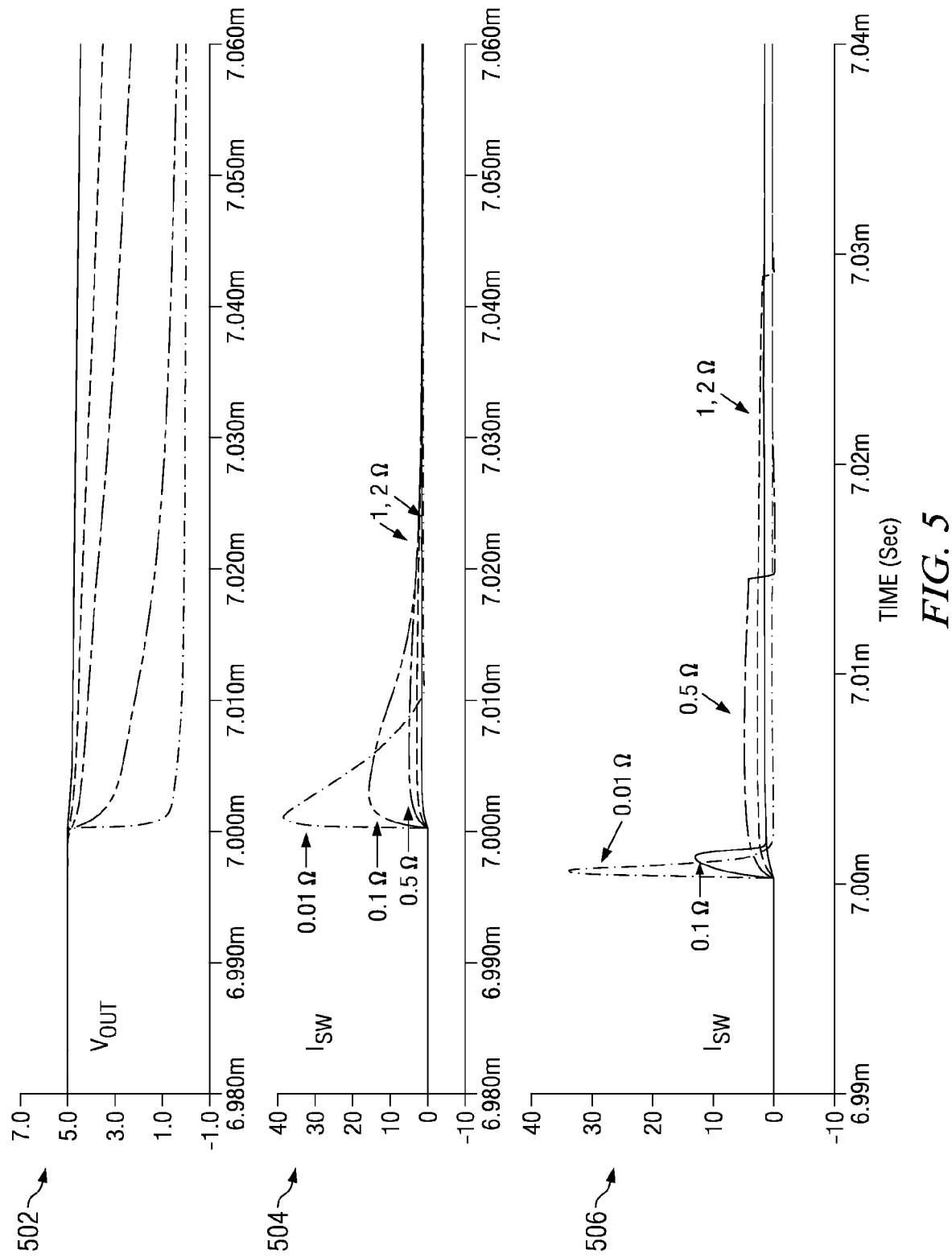
FIG. 5 is a comparative diagram of example circuit simulation waveform results from a simulation of the switch current for the power distribution switch of FIG. 2 and the switch current for the conventional circuit shown in FIG. 1.

FIG. 5 is a comparative diagram of example circuit simulation waveform results 502, 504, 506 from a simulation of the switch current for the power distribution switch 200 of FIG. 2 and of the switch current for the conventional circuit 100 shown in FIG. 1. The waveform set 502 illustrates the Vout waveforms shown in FIG. 4 as waveform set 402. The currents ($I_{SW}$) through a conventional power distribution switch during a hard short are shown in the waveform set 504. These waveforms may be compared to the corresponding waveforms in the waveform set 506, which illustrates the currents $I_{SW}$ through the example switching device 202 during the same hard shorts, using the example power distribution switch 200 described herein. The currents $I_{SW}$ in the waveform set 506 are substantially shorter in duration than those in the waveform set 504, causing less energy dissipation in the coupled output device.

Figure 6:
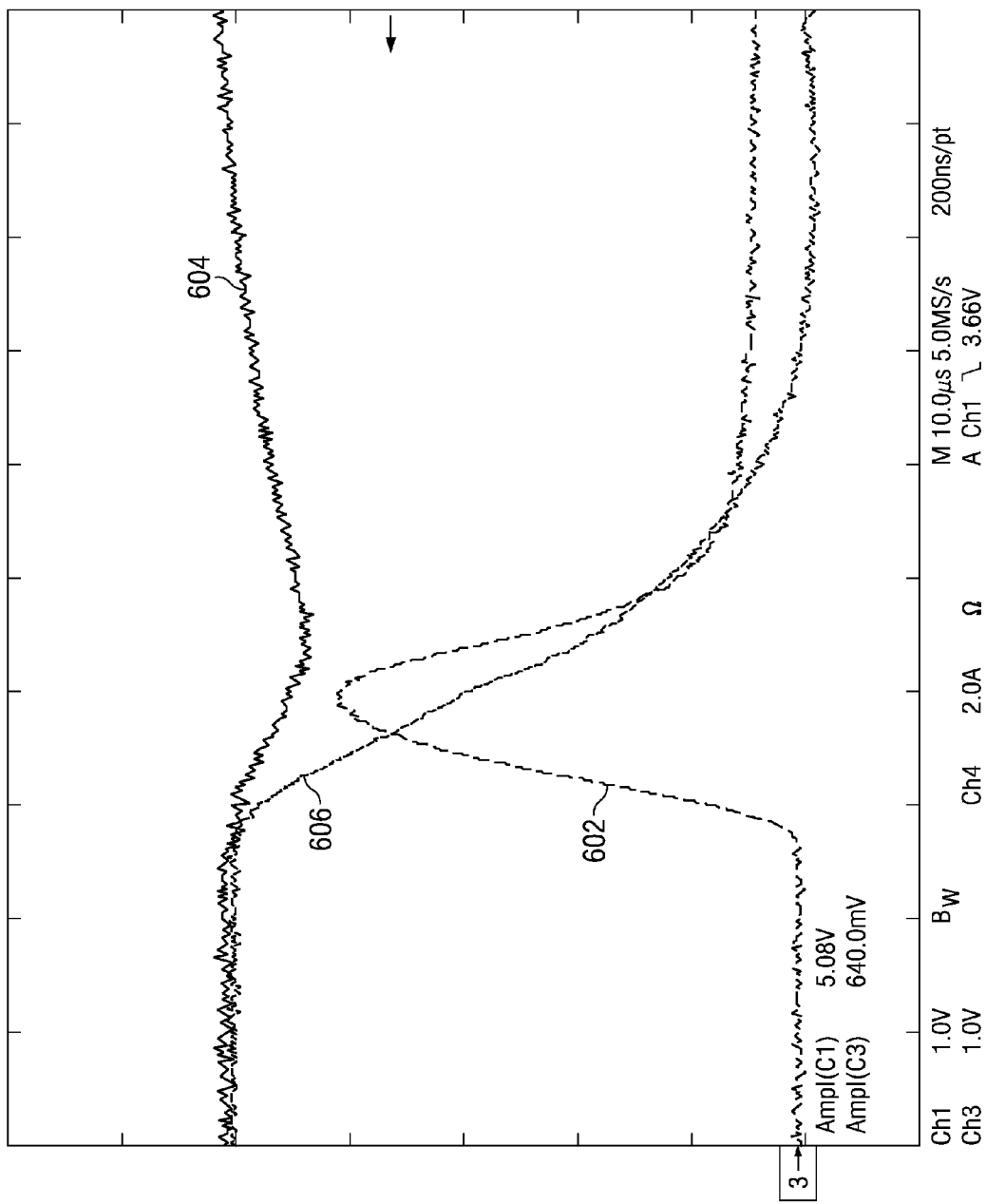
FIGS. 6 and 7 are example measurement waveforms of the operational switch currents, input voltages, and output voltages of the conventional circuit of FIG. 1 and the example power distribution switch of FIG. 3 in response to a hard short-circuit.
Figure 7:
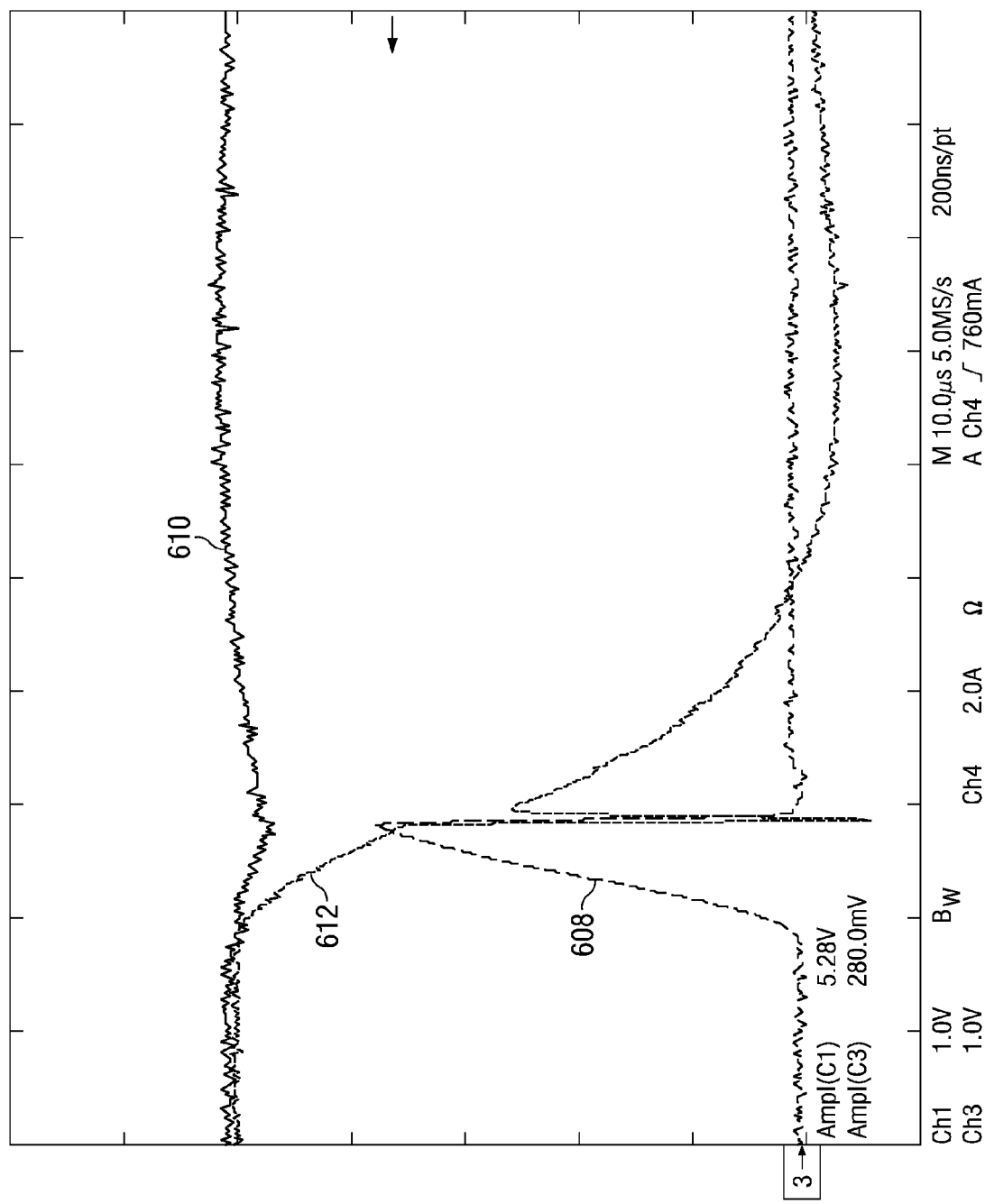

FIGS. 6 and 7 are example measurement waveforms of the operational switch currents 602 and 702, input voltages 604 and 704, and output voltages 606 and 706 of the conventional circuit 100 of FIG. 1 and the example power distribution switch 200 of FIG. 3, respectively, in response to a hard short-circuit. In general, a visual comparison of FIGS. 6A and 6B reveals that the example power distribution switch 200 of FIG. 3 yields a faster response to a hard short-circuit condition than the conventional circuit 100 of FIG. 1. Particularly, it is noted that the switch current waveform 702 of the example power distribution switch 200 has a lower peak current and is reduced in less time than the switch current waveform 602 of the conventional circuit 100. It is further noted that the input voltage (e.g., Vin) waveform 704 of the example power distribution switch 200 suffers a less severe reduction in voltage, and thus recovers more quickly, than the corresponding input voltage waveform 604 of the conventional circuit 100.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A power distribution switch to detect a hard short-circuit condition, comprising:
    a switching device having a resistance between an input terminal and an output terminal, to conduct a current from an input power source having an input voltage to an output terminal having an output voltage;
    a voltage feedback loop having a digital output voltage, configured to increase the resistance of the switching device in response to a short-circuit based on a predetermined portion of the input voltage and the output voltage; and
    an analog current feedback loop configured to increase the resistance of the switching device based on an independent measurement of current through the switching device and a reference current, wherein the switching device comprises a first current path and a second current path between a single power source input and a single load and the first current path is responsive to the digital voltage feedback loop.

2. A power distribution switch as defined in claim 1, wherein the digital voltage feedback loop is configured to generate a digital control signal based on the output voltage.

3. A power distribution switch as defined in claim 1, wherein the analog current feedback loop is configured to generate an analog control voltage to increase the resistance of the switching device.

4. A power distribution switch as defined in claim 1, wherein the digital voltage feedback loop is configured to increase the resistance of the switching device by increasing the resistance of the first current path.

5. A power distribution switch as defined in claim 4, wherein increasing the resistance of the first current path comprises disabling the first current path.

6. A power distribution switch as defined in claim 1, wherein the second current path is responsive to the analog current feedback loop.

7. A power distribution switch as defined in claim 1, wherein the switching device comprises one or more field effect transistors.

8. A power distribution switch as defined in claim 1, wherein the digital voltage feedback loop comprises a comparator and a voltage divider.

9. A power distribution switch as defined in claim 8, wherein the voltage divider is configured to generate a comparator reference voltage that is less than the input voltage.

10. A power distribution switch as defined in claim 9, wherein the digital voltage feedback loop further comprises an RC filter configured to diminish a voltage drop in the comparator reference voltage in response to a corresponding voltage drop at the input voltage.

11. A power distribution switch as defined in claim 1, wherein the analog current feedback loop comprises an amplifier, a sense resistor, and a charge pump.

12. A power distribution switch as defined in claim 1, wherein the switching device comprises a plurality of conduction paths.

13. A power distribution switch as defined in claim 12, wherein the digital voltage feedback loop is configured to increase the resistance of the switching device by disabling at least one of the conduction paths in response to a decrease in the output voltage.

14. A power distribution switch to detect a hard short-circuit condition, comprising:
    an output device configured to conduct current from an input terminal comprising an input voltage to an output terminal comprising an output voltage, wherein the output device comprises a plurality of parallel conduction paths;
    an analog current feedback loop configured to increase the resistance of the output device based on an independent measurement of current through the output device and a reference current;
    a digital voltage feedback loop configured to detect a drop in the output voltage corresponding to a short-circuit condition, comprising a voltage divider configured to generate a reference voltage based on the input voltage, and a comparator configured to disable at least one of the conduction paths based on a comparison of the reference voltage and the output voltage.

15. A power distribution switch as defined in claim 14, wherein the output device comprises a resistance that may be increased based on the comparison.

16. A power distribution switch as defined in claim 14, wherein the digital voltage feedback loop further comprises a capacitor configured to delay a drop in the reference voltage in response to a drop in the input voltage.

17. A power distribution switch to detect a hard short-circuit condition, comprising:
    a first field effect transistor (FET) configured to couple an input power source having an input voltage to an output terminal having an output voltage, the first FET having a resistance based on a gate voltage;
    a plurality of FETs configured to selectively couple the input power source to the output terminal, wherein each of the plurality of FETs has a resistance based on the gate voltage;

a first switching element configured to selectively couple a gate terminal of each of the plurality of FETs to the gate voltage and a second switching element configured to selectively couple the gate terminal of each of the plurality of FETs to a ground reference voltage, wherein the first switching element and the second switching element are not simultaneously conducting;

an input capacitor configured to filter the input voltage and an output capacitor to filter the output voltage;

a first feedback loop configured to generate the gate voltage, comprising a sense FET configured to pull current through a sense resistor to generate a sense voltage, a reference current generator configured to pull current through a reference resistor to generate a current reference voltage, an amplifier configured to generate the gate voltage based on the reference voltage and the sense voltage, and a charge pump configured to generate an amplifier supply voltage greater than the input voltage; and a second feedback loop configured to control the first and the second switching elements, comprising a voltage divider configured to generate a comparator reference voltage that is less than the input voltage, an RC filter configured to diminish a voltage drop in the comparator reference voltage in response to a corresponding voltage drop at the input voltage, and a comparator configured to control the first and second switching elements based on the comparator reference voltage and the output voltage.

* * * * *